(12) United States Patent
Jang et al.

(10) Patent No.: US 11,758,794 B2
(45) Date of Patent: Sep. 12, 2023

(54) ORGANIC LIGHT EMITTING DISPLAY DEVICE INCLUDING CAMERA DISPOSITION AND PANEL IDENTIFICATION AREAS

(71) Applicant: LG Display Co., Ltd., Seoul (KR)

(72) Inventors: JooYoung Jang, Gumi-si (KR); HyunSeok Hong, Gumi-si (KR); DoHyung Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 220 days.

(21) Appl. No.: 17/125,355

(22) Filed: Dec. 17, 2020

(65) Prior Publication Data

US 2021/0193751 A1 Jun. 24, 2021

(30) Foreign Application Priority Data

Dec. 20, 2019 (KR) .......................... 10-2019-0171592

(51) Int. Cl.
| | |
|---|---|
| *H01L 27/32* | (2006.01) |
| *H01L 27/14* | (2006.01) |
| *H01L 51/52* | (2006.01) |
| *H01L 27/146* | (2006.01) |

(52) U.S. Cl.
CPC ...... *H01L 27/3223* (2013.01); *H01L 27/3258* (2013.01); *H01L 51/5253* (2013.01); *G09G 2300/0408* (2013.01); *G09G 2300/0804* (2013.01); *H01L 27/14678* (2013.01); *H01L 27/323* (2013.01); *H01L 27/3211* (2013.01); *H01L 2251/301* (2013.01)

(58) Field of Classification Search
CPC ............. H01L 27/3223; H01L 27/3258; H01L 27/323; H01L 27/3246; H01L 27/3225; H01L 27/14678; H01L 27/3211; H01L 27/3297; H01L 51/5253; H01L 51/5256; H01L 51/52; H01L 2251/301; G06F 3/0412; G06F 3/0446; G09G 2300/0408; G09G 2300/0804
See application file for complete search history.

(56) References Cited

U.S. PATENT DOCUMENTS

| | | | | |
|---|---|---|---|---|
| 2003/0003608 | A1* | 1/2003 | Arikado | ................ H01L 23/544 257/E23.179 |
| 2007/0085939 | A1* | 4/2007 | You | .................... G02F 1/136227 349/43 |
| 2008/0136993 | A1* | 6/2008 | Jeong | .................... G02F 1/1333 430/323 |
| 2008/0149732 | A1* | 6/2008 | Lo | ........................ H05K 1/0266 235/492 |
| 2016/0268212 | A1* | 9/2016 | Suzuki | .................. H01L 23/544 |
| 2019/0131248 | A1* | 5/2019 | Kong | ............... G06K 19/06009 |
| 2019/0137808 | A1* | 5/2019 | Koide | ...................... G09G 3/20 |

(Continued)

FOREIGN PATENT DOCUMENTS

KR 10-2004-0058840 A 7/2004

*Primary Examiner* — Ida M Soward
(74) *Attorney, Agent, or Firm* — Polsinelli PC

(57) ABSTRACT

An organic light emitting display device includes a substrate having a display area displaying an image and a non-display area surrounding the display area; a camera disposition area provided within the display area; a panel identification area provided in the non-display area; and an upper protective layer covering the camera disposition area and the panel identification area.

20 Claims, 7 Drawing Sheets

(56) References Cited

U.S. PATENT DOCUMENTS

| | | | | |
|---|---|---|---|---|
| 2019/0157304 A1* | 5/2019 | Miyamoto | | H01L 27/1244 |
| 2019/0189636 A1* | 6/2019 | Gang | | G02F 1/133308 |
| 2019/0207156 A1* | 7/2019 | Gil | | H01L 51/5203 |
| 2019/0214596 A1* | 7/2019 | Park | | H01L 27/323 |
| 2019/0384102 A1* | 12/2019 | Lee | | G02F 1/133514 |
| 2020/0044006 A1* | 2/2020 | Lee | | H01L 27/3276 |
| 2020/0168691 A1* | 5/2020 | Choi | | H01L 27/3276 |
| 2020/0174319 A1* | 6/2020 | Chang | | H04M 1/0266 |
| 2020/0176538 A1* | 6/2020 | Um | | H01L 51/5237 |
| 2020/0176709 A1* | 6/2020 | Moon | | G06F 3/0412 |
| 2020/0212357 A1* | 7/2020 | Lim | | H01L 27/3246 |
| 2020/0273938 A1* | 8/2020 | Yoon | | H01L 51/0096 |
| 2020/0312933 A1* | 10/2020 | Lee | | H01L 27/3258 |
| 2020/0409201 A1* | 12/2020 | Shiina | | G09F 9/30 |
| 2021/0043135 A1* | 2/2021 | Zhao | | G09G 3/3266 |
| 2021/0356802 A1* | 11/2021 | Liao | | G02F 1/133302 |
| 2022/0077193 A1* | 3/2022 | Shin | | G06F 3/0443 |

* cited by examiner

ORGANIC LIGHT EMITTING DISPLAY DEVICE INCLUDING CAMERA DISPOSITION AND PANEL IDENTIFICATION AREAS

CROSS-REFERENCE TO RELATED APPLICATION

This application claims the priority benefit of Korean Patent Application No. 10-2019-0171592 filed on Dec. 20, 2019, which is hereby incorporated by reference in its entirety.

BACKGROUND

Field of the Disclosure

The present disclosure relates to an organic light emitting display device, and more particularly, relates to a panel ID of a display device in which a camera is disposed in a display area.

Description of the Background

As an information-oriented society has advanced, the demand for display devices for displaying images has been increasing, and various types of display devices such as liquid crystal display devices and organic light emitting display devices have been utilized.

Such a display device may include a display panel in which a plurality of sub-pixels are disposed to display an image, and various driving circuits for driving the sub-pixels disposed in the display panel.

In addition, the display device may perform a function of detecting an object approaching the display panel, in addition to a function of displaying an image, to thereby perform input processing based on detection information, or may capture an object approaching the display panel to thereby provide a function of displaying a captured video or image through the display panel.

Accordingly, the display device may include a sensor such as a proximity sensor or a camera sensor depending on a required function. Such a sensor, for example, may be disposed in a bezel area where an image is not displayed in the display panel.

Alternatively, in some cases, to prevent an increase in the bezel area of the display panel, a camera sensor or the like may be positioned in a portion of an active area where an image is displayed in the display panel.

Thus, studies for solving problems that occur when a hole for disposing a camera sensor or the like is positioned in the active area are being conducted actively.

SUMMARY

Accordingly, the present disclosure is to provide a structure for disposing an imaging device (such as a camera or the like) within a display area. Another object to be achieved by the present disclosure is to provide a method of improving vulnerability that may occur in the disposition structure.

The present disclosure is not limited to the above-mentioned objects, and other objects, which are not mentioned above, can be clearly understood by those skilled in the art from the following descriptions.

According to an aspect of the present disclosure, an organic light emitting display device includes a substrate having a display area divided to display an image and a non-display area around the display area. A camera disposition area may be provided within the display area, and a panel identification area may be provided in the non-display area. The organic light emitting display device may include an upper protective layer covering the camera disposition area and the panel identification area.

Other detailed matters of the exemplary aspects are included in the detailed description and the drawings.

In the organic light emitting display device according to an exemplary aspect of the present disclosure, the same protective layer as the upper protective layer formed of an organic material, which prevents layer delamination from occurring in an upper portion of the camera disposition area of the display area is disposed on the panel identification area disposed in the non-display area of the substrate. Thus, a phenomenon in which a panel identification layer is etched and lost by a chemical solution that is used when removing the protective layer on the second area A3 may be prevented. Accordingly, problems such as a process delay occurring due to damage to the panel ID, and inability to track a process history of the display panel, are not caused, so that productivity can be further improved.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
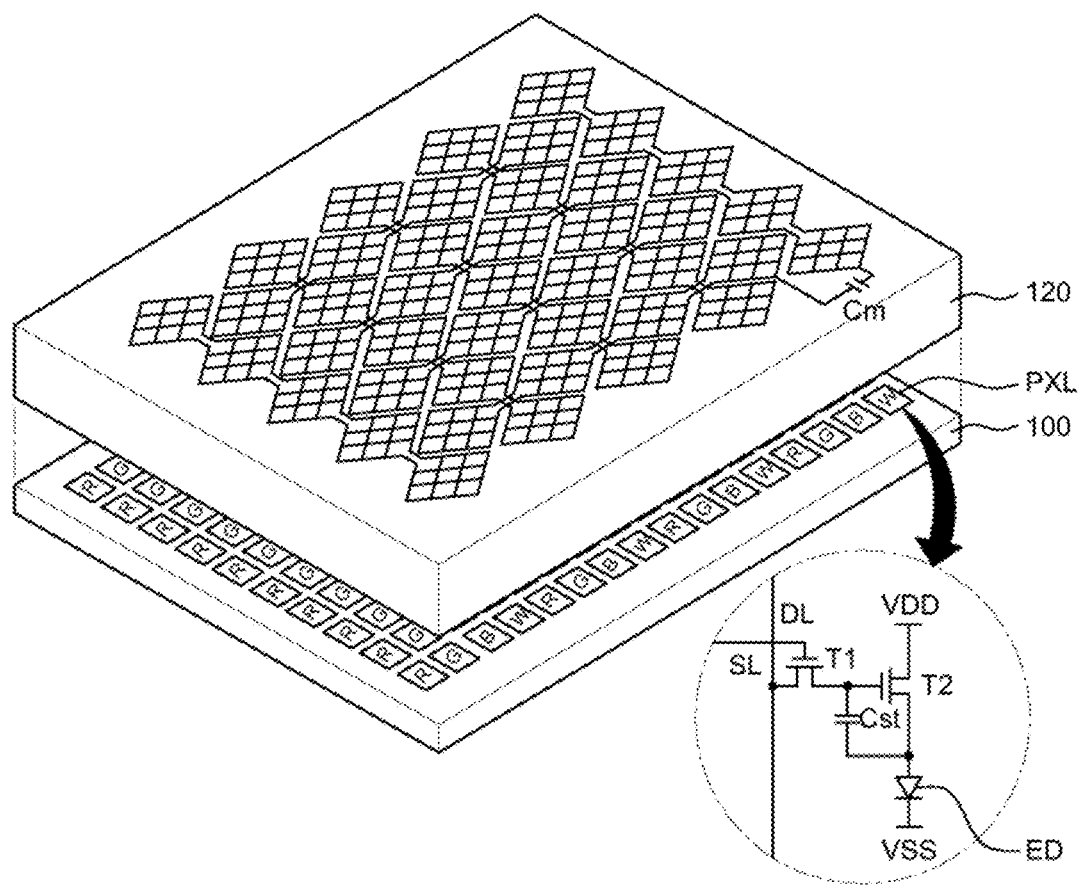
FIG. 1 is an exploded perspective view illustrating an organic light emitting display device integrated with a touch sensor.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a display device according to exemplary aspects of the present disclosure will be described in detail with reference to accompanying drawings.

FIG. 1 is a perspective view illustrating an organic light emitting display device having a touch sensor according to the present disclosure.

Figure 2:
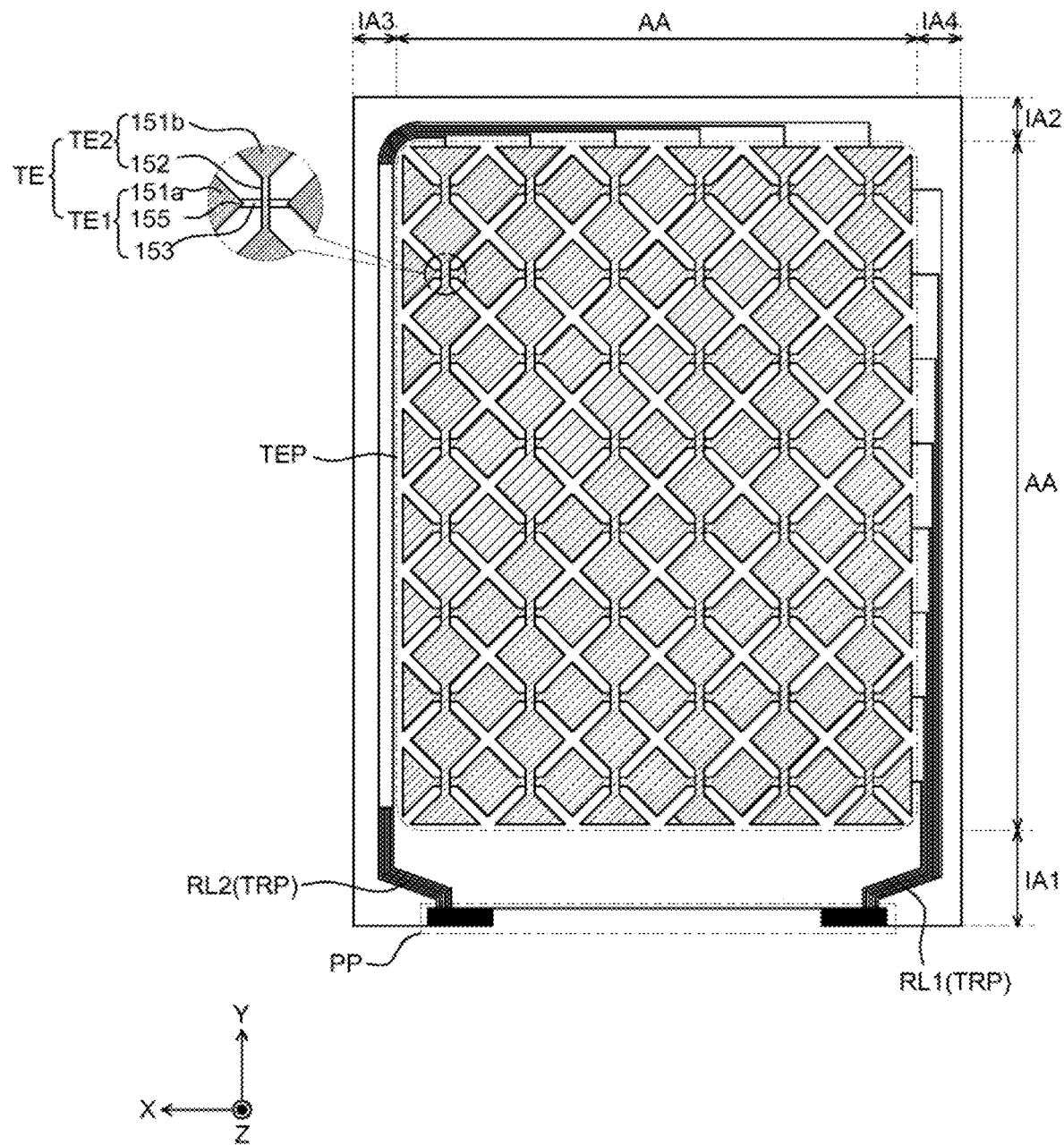
FIG. 2 is a view for explaining a touch sensor layer illustrated in FIG. 1.

The organic light emitting display device having the touch sensor illustrated in FIG. 1 detects variance in mutual capacitance (Cm; a touch sensor) by a user's touch through touch electrodes TE1 and TE2 illustrated in FIG. 2 during a touch period to thereby sense presence or absence of a touch, and a touch position. In addition, the organic light emitting display device having the touch sensor illustrated in FIG. 1 displays an image through unit pixels including light emitting elements ED. The unit pixels are composed of red R, green G and blue B sub-pixels PXL, or composed of red R, green G, blue B, and white W sub-pixels PXL.

To this end, the organic light emitting display device illustrated in FIG. 1 includes a plurality of the sub-pixels PXL arranged in a matrix form on a substrate 100, an encapsulation part 120 disposed on the plurality of sub-pixels PXL, and the mutual capacitance Cm disposed on the encapsulation part 120.

Each of the plurality of sub-pixels PXL includes a pixel driving circuit and the light emitting element ED connected to the pixel driving circuit.

The pixel driving circuit includes a switching transistor T1, a driving transistor T2, and a storage capacitor Cst.

The switching transistor T1 is turned on when a scan pulse is supplied to a scan line SL to thereby supply a data signal supplied to a data line DL to the storage capacitor Cst and a gate electrode of the driving transistor T2.

The driving transistor T2 controls a current supplied from a high voltage (VDD) supply line to the light emitting element ED in response to the data signal supplied to the gate electrode of the driving transistor T2 to thereby control the amount of light emitted from the light emitting element ED. In addition, even when the switching transistor T1 is turned off, the driving transistor T2 supplies a constant current by means of a voltage charged in the storage capacitor Cst until a data signal of the next frame is supplied, thereby maintaining a light emitting state of the light emitting element ED.

In FIG. 1, the pixel driving circuit is defined as including the switching transistor T1, the driving transistor T2, and the storage capacitor Cst, but is not limited thereto. The numbers of transistors and capacitors may be variously changed.

FIG. 2 is a view for explaining a touch sensor layer illustrated in FIG. 1.

The organic light emitting display device integrated with a touch sensor according to an exemplary aspect of the present disclosure refers to a touch screen-integrated display device having a structure in which a touch sensor layer is formed on an encapsulation layer, rather than having a structure in which a separate touch panel is bonded to an upper portion of a display panel.

The touch sensor layer is disposed on the encapsulation layer and senses a touch according to a touch object. Here, the touch object may include various means used for a user to input a touch, such as a user's finger, a touch pen or the like.

The touch sensor layer according to an exemplary aspect may include a touch electrode unit TEP, a touch routing unit TRP, and an auxiliary line unit.

The touch electrode unit TEP may include touch electrodes TE disposed on a display area AA (active area) of the substrate 100.

The touch electrodes TE may include a plurality of first touch electrodes TE1 and a plurality of second touch electrodes TE2.

The plurality of first touch electrodes TE1 are disposed on the display area AA of the substrate 100 to be spaced apart from each other in a second direction Y while extending in a first direction X. The plurality of first touch electrodes TE1 may be used as touch sensing electrodes (or touch driving electrodes) for sensing a touch position of a touch object.

Each of the plurality of first touch electrodes TE1 according to an exemplary aspect may include a plurality of first electrode patterns 151A and a plurality of bridge patterns 153.

The plurality of respective first electrode patterns 151A are disposed on the display area AA of the substrate 100 to be spaced apart from each other in the first direction X.

The plurality of respective of bridge patterns 153 are disposed on the display area AA of the substrate 100 to be spaced apart from each other in the first direction X and electrically connect two first electrode patterns 151A adjacent to each other in the first direction X. Each of the plurality of bridge patterns 153 is disposed to overlap a space between the two first electrode patterns 151A adjacent to each other in the first direction X, thereby preventing that the first touch electrode TE1 and the second touch electrode TE2 are shorted from each other in a crossing area thereof.

One side of each of the plurality of bridge patterns 153 is electrically connected to one first electrode pattern 151A disposed on one side of the two first electrode patterns 151A adjacent to each other in the first direction X, and the other side of each of the bridge patterns 153 is electrically connected to the other first electrode pattern 151A disposed on the other side of the two first electrode patterns 151A adjacent to each other in the first direction X. Each of the plurality of bridge patterns 153 according to an exemplary aspect may be formed in a shape of a straight line, but is not limited thereto. Each of the plurality of bridge patterns 153 may be formed to have a variety of shapes, such as a curved shape, an angled shape, or a mesh shape to electrically connect the two first electrode patterns 151A adjacent to each other in the first direction X.

The plurality of second touch electrodes TE2 are disposed on the display area AA of the substrate 100 in such a manner that they extend in the first direction X and are spaced apart from each other in the second direction Y to thereby be electrically separated from the plurality of first touch electrodes TE1. The plurality of second touch electrodes TE2 may be used as touch driving electrodes (or touch sensing electrodes) for sensing a touch position of a touch object.

The plurality of respective second touch electrodes TE2 according to an exemplary aspect may include a plurality of second electrode patterns 151B and a plurality of connection lines 152.

The plurality of respective second electrode patterns 151B are disposed on the display area AA of the substrate 100 to be spaced apart from each other in the second direction Y.

Each of the plurality of connection lines 152 is disposed between two second electrode patterns 151B adjacent to each other in the second direction Y and electrically connects the two second electrode patterns 151B adjacent to each other in the second direction Y. Each of the plurality of connection lines 152 may be disposed on the same layer as each of the plurality of second electrode patterns 151B. Accordingly, each of the plurality of connection lines 152 and each of the plurality of second electrode patterns 151B may be formed as a single body. Each of the plurality of connection lines 152 is disposed to intersect each of the plurality of bridge patterns 153.

Meanwhile, the plurality of bridge patterns 153 of the first touch electrode TE1 may be changed to the plurality of connection lines 152 of the second touch electrode TE2. Also, the plurality of connection lines 152 of the second touch electrode TE2 may be changed to the plurality of bridge patterns 153 of the first touch electrode TE1.

The touch sensor layer according to an exemplary aspect includes a first touch electrode layer including the plurality of bridge patterns 153, a second touch electrode layer including the plurality of first electrode patterns 151A and the plurality of second touch electrodes TE2, and a first touch insulating layer disposed between the first touch electrode layer and the second touch electrode layer. Here, the first touch electrode layer may be disposed below or above the second touch electrode layer with the first touch insulating layer therebetween. As an example, the touch sensor layer may include a first touch electrode layer having a bridge pattern 153, a first touch insulating layer disposed on the first touch electrode layer, and a second touch electrode layer having first touch electrodes TE1 and second touch electrodes TE2 disposed on the first touch insulating layer. As another example, the touch sensor layer includes a first touch electrode layer having first touch electrodes TE1 and second touch electrodes TE2, a first touch insulating layer disposed on the first touch electrode layer, and a second touch electrode layer having a bridge pattern 153 disposed on the touch insulating layer.

The first touch insulating layer includes bridge contact holes 155 provided in overlapping areas of the first electrode patterns 151A and the bridge patterns 153. Accordingly, each of the plurality of bridge patterns 153 is electrically connected to one side and the other side of the corresponding first electrode pattern 151A through the bridge contact holes 155 provided in the first touch insulating layer, thereby electrically connecting the two first electrode patterns 151A adjacent to each other in the first direction X.

Each of the plurality of first touch electrodes TE1 and the plurality of second touch electrodes TE2 according to an exemplary aspect may include a mesh structure in which metal lines having very small line widths cross each other. Here, the metal lines may have a single layer or a multilayer structure formed of a conductive material such as molybdenum (Mo), silver (Ag), titanium (Ti), copper (Cu), aluminum (Ti), titanium/aluminum/titanium (Ti/Al/Ti), molybdenum/aluminum/molybdenum (Mo)/Al/Mo) or the like.

Each of the plurality of first electrode patterns 151A and the plurality of second electrode patterns 151B may have a polygonal shape, for example, a rhombus shape, in a plan view. In this case, each of the electrode patterns 151A and 151B disposed along edge portions of the display area AA may have a triangular shape. Each of the plurality of first electrode patterns 151A and the plurality of second electrode patterns 151B may be simultaneously formed by a process of forming a mesh-shaped metal lines crossing each other on the encapsulation layer, and a process of cutting the metal lines formed on touch electrode boundary areas which are preset on the display area AA to thereby form the plurality of first electrode patterns 151A, the plurality of second electrode patterns 151B, and the plurality of connection lines 152.

The touch screen-integrated organic light emitting display device according to the present disclosure senses a touch using mutual capacitance between the first touch electrode TE1 and the second touch electrode TE2. The mutual capacitance is mainly formed in an outer portion of each of the first touch electrode TE1 and the second touch electrode TE2 adjacent to each other with a touch boundary area therebetween. Accordingly, in the present application, by forming cut portions of metal lines positioned on the outer portion of each of the first touch electrode TE1 and the second touch electrode TE2 in protrusion shapes, an area (or length) of each outer portion of the first touch electrode TE1 and the second touch electrode TE2 may increase to thereby increase the mutual capacitance formed in the touch boundary area (or a sensing area) between the first touch electrode TE1 and the second touch electrode TE2. Accordingly, it is feasible to improve sensing sensitivity of a touch.

The touch routing unit TRP is provided in a non-display area IA (inactive area) of the substrate 100 and is electrically connected to the touch electrodes TE provided on the touch sensor layer. The touch routing unit TRP according to an exemplary aspect may include a plurality of first touch routing lines TRL1 and a plurality of second touch routing lines TRL2.

The plurality of first touch routing lines TRL1 may be connected one-to-one to the plurality of first electrodes TE1 provided on the touch sensor layer. The plurality of respective first touch routing lines TRL1 are disposed over the other side of a first non-display area IA1 and a fourth non-display area IA4 (or a third non-display area IA3) of the substrate 100. One ends of the plurality of first touch routing lines TRL1 according to an exemplary aspect may be connected one-to-one to the plurality of first electrodes TE1 in the fourth non-display area IA4 (or the third non-display area IA3) of the substrate 100.

The plurality of second touch routing lines TRL2 may be connected one-to-one to the plurality of second electrodes TE2 provided on the touch sensor layer. The plurality of respective second touch routing lines TRL2 may be disposed over one side of the first non-display area IA1, and a second non-display area IA2 and the third non-display area IA3 (or the fourth non-display area IA4) of the substrate 100. One ends of the plurality of second touch routing lines TRL2 according to an exemplary aspect may be connected one-to-one to the plurality of second electrodes TE2 in the second non-display area IA2 of the substrate 100.

The touch screen-integrated organic light emitting display device according to an exemplary aspect of the present disclosure may further include a pad portion PP, gate driving circuits, a driving integrated circuit, a flexible circuit cable, and a touch driving circuit.

The pad portion PP may include a plurality of pads provided in the non-display area IA of the substrate 100. The pad portion PP according to an exemplary aspect includes a plurality of common power supply pads, a plurality of data input pads, a plurality of power supply pads, a plurality of control signal input pads, and a plurality of touch driving pads that are provided in the first non-display area IA1 of the substrate 100.

The gate driving circuits 180 are provided in the third non-display area IA3 and/or the fourth non-display area IA4 of the substrate 100 and connected one-to-one to scan lines SL provided in the display area AA. The gate driving circuits 200 are integrated in the third non-display area IA3 and/or the fourth non-display area IA4 of the substrate 100, with a process of manufacturing a pixel array layer, that is, a process of manufacturing a thin film transistor. The gate driving circuits 200 generate scan signals based on a gate control signal supplied from the driving integrated circuit and output the scan signals in a predetermined sequence to thereby drive the respective scan lines SL in a predetermined sequence. The gate driving circuit 180 according to an exemplary aspect may include a shift register.

Meanwhile, the plurality of first touch routing lines TRL1 are disposed between the touch electrode unit TEP and the auxiliary line unit ALP so as to overlap the gate driving circuits 180 in the fourth non-display area IA4, so that an increase in a width of a bezel according to the fourth non-display area IA4 of the substrate 100, due to a disposition area of the plurality of first touch routing lines TRL1, may be minimized. Similarly, the plurality of second touch routing lines TRL2 are disposed between the touch electrode unit TEP and the auxiliary line unit ALP so as to overlap the gate driving circuits 180 in the third non-display area IA3 of the substrate 100, an increase in a width of a bezel according to the third non-display area IA3 of the substrate 100, due to a disposition area of the plurality of second touch routing lines TRL2, may be minimized.

The driving integrated circuit is mounted in a chip mounting area defined in the first non-display area IA1 of the substrate 100 through a chip mounting (or bonding) process. Input terminals of the driving integrated circuit are electrically connected to the pad portion PP, and the input terminals of the driving integrated circuit are electrically connected to the plurality of data lines DL and a plurality of pixel driving power lines PL that are provided in the display area AA. The driving integrated circuit receives a variety of power, timing synchronization signals, digital image data and the like that are input from a display driving circuit unit (or a host circuit) through the pad portion PP, generates the gate control signal according to the timing synchronization signal to control a driving of a gate driving circuit 180, and at the same time, converts the digital image data into a pixel data voltage in analog form to supply it to a corresponding data line DL.

The flexible circuit cable is attached to the pad portion PP. The flexible circuit cable electrically connects the display driving circuit unit and the pad portion PP and electrically connects the pad portion PP and the touch driving circuit.

The touch driving circuit is mounted on the flexible circuit cable through a chip mounting (or bonding) process. The touch driving circuit is electrically connected to the other end of each of the plurality of first touch routing lines TRL1 and the other end of each of the plurality of second touch routing lines TRL2 through the plurality of touch driving pads provided in the pad portion PP. The touch driving circuit supplies a touch driving pulse to each of the plurality of second touch electrodes TE2 through the pad portion PP and the plurality of second touch routing lines TRL2 in response to the touch synchronization signal provided from the host circuit. The touch driving circuit senses changes in capacitance between the first touch electrode TE1 and the second touch electrode TE2 through the pad portion PP and the plurality of first touch routing lines TRL1, generates touch raw data, and provides the generated touch raw data to the host circuit. The host circuit calculates touch location information regarding a touch object based on the touch row data provided from the touch driving circuit during a touch report period, and executes an application program associated with the calculated touch location information.

Optionally, the touch driving circuit may be built in the driving integrated circuit. In this case, the other ends of each of the plurality of first touch routing lines TRL1 and the plurality of second touch routing lines TRL2 are not connected to the pad portion PP but are electrically connected to the driving integrated circuit. The driving integrated circuit supplies a touch driving pulse to each of the plurality of second touch electrodes TE2 through the plurality of second touch routing lines TRL2 in response to the touch synchronization signal provided from the host circuit. The driving integrated circuit senses changes in capacitance between the first touch electrode TE1 and the second touch electrode TE2 through the plurality of the first touch routing lines TRL1, generates touch raw data, and provides the generated touch raw data to the host circuit through the pad portion PP.

The touch screen-integrated organic light emitting display device according to an exemplary aspect of the present disclosure may further include a data distribution circuit for reducing a circuit size of the driving integrated circuit.

The data distribution circuit sequentially distributes data voltages that are sequentially input from the driving integrated circuit for every time division sections of one horizontal period, to n data lines corresponding to the number of n (n is a natural number of 2 or more) time division sections during one horizontal period. The data distribution circuit according to an exemplary aspect includes a plurality of demultiplexing circuits.

Each of the plurality of demultiplexing circuits may include one input terminal connected to an output channel of the driving integrated circuit, first to nth control terminals that individually receive first to third time division control signals from the driving integrated circuit, and first to nth output terminals connected to the n data lines. Here, assuming that n is 3, and that one horizontal period includes the first to third time division sections, each of the plurality of demultiplexing circuits may supply a first data voltage supplied from the driving integrated circuit in response to a first time division control signal for each first time division section of the horizontal period, to a 3i-2nd (i is a natural number) data line, may supply a second data voltage supplied from the driving integrated circuit in response to a second time division control signal for each second time division section of the horizontal period, to a 3i-1st data line, and may supply a third data voltage supplied from the driving integrated circuit in response to a third time division control signal for each third time division section of the horizontal period, to a 3i data line.

Figure 3:
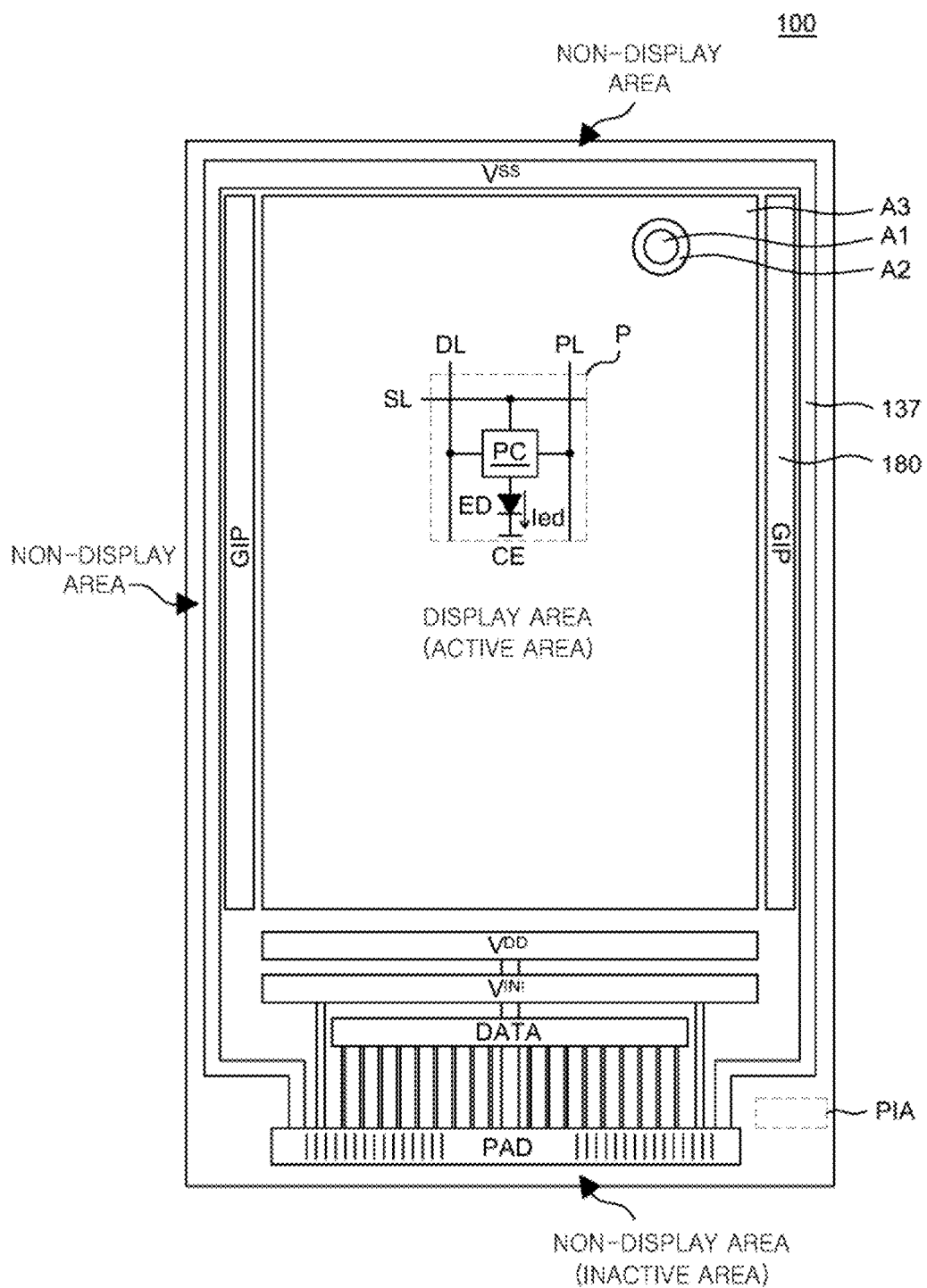
FIG. 3 is a plan view of a display panel illustrated in FIG. 1.

FIG. 3 is a plan view of a display panel illustrated in FIG. 1

With reference to FIG. 3, the display panel may include the substrate 100, a pixel array layer, a common power line 137, an encapsulation layer, a camera disposition area, and a panel identification area PIA.

The substrate 100 is a base substrate (or a base layer) and includes a plastic material or a glass material. The substrate 100 according to an exemplary aspect may have a quadrangular shape, a quadrangular shape in which respective corner portions are rounded to have a constant radius of curvature, or a non-quadrangular shape having at least six sides, in a plan view. Here, the substrate 100 having a non-quadrangular shape may include at least one protrusion or at least one notch portion.

The substrate 100 according to an exemplary aspect may be divided into a display area AA (active area) and a non-display area IA (inactive area).

The display area AA is provided in a central area of the substrate 100 and may be defined as an area for displaying an image. Hereinafter, for convenience of description, an inner portion of the display area AA is described as being divided into a first area A1, a second area A1, and a third area A3. Although an image is not displayed in the first area A1 and the second area A2, since the first area A1 and the second area A2 are surrounded by the third area A3 in which image display elements are disposed, they are classified as the display area AA in this specification. Meanwhile, the first area A1 and the second area A2 may be provided at any position on a plane, and they are not limited to be positioned at a location shown in FIG. 3.

The first area A1 is a portion where an opening is provided and an imaging device such as a camera or the like is disposed. The first area A1 is provided inside the display area AA. The first area A1 is an area where a camera or the like is located, and does not display an image. The first area A1 may be formed in a shape such as a circle or an ellipse.

The third area A3 is a portion where pixels are disposed. The pixels are unit structures that exhibit color (or light). The pixels may include red, green, blue, and white subpixels. The pixels include light emitting elements (light emitting diodes or the like), element control circuits, and the like.

The second area A2 is located between the first area A1 and the third area A3. That is, it may be a boundary area disposed in contact with an outer edge of the first area in which the opening is provided. Since the second area A2 surrounds the outer edge of the first area A1, the second area A2 may have a shape corresponding to a shape of the first area A1, but the shape thereof is not limited thereto. For example, when the first area A1 is formed in a circular shape, the second region A2 may be formed in a circular or elliptical shape.

The second area A2 separates the first area A1 from the third area A3, so that the first area A1 and the third area A3 are not affected by each other. For example, the second area A2 prevents an organic light emitting layer and/or an encapsulation layer formed in the third area A3 from penetrating into the first area A1. In addition, the second area A2 prevents damage that may occur when forming the first area A1 from being transmitted to the third area A3. The second area A2 may include structures for prevention functions described above. The display area AA according to an exemplary aspect may have a quadrangular shape, a quadrangular shape in which respective corner portions are rounded to have a constant radius of curvature, or a non-quadrangular shape having at least six sides, in a plan view. Here, the display area AA having a non-quadrangular shape may include at least one protrusion or at least one notch portion.

The non-display area IA is provided in an edge area of the substrate 100 to surround the display area AA, and may be defined as an area where an image is not displayed, or a peripheral area. The non-display area IA according to an exemplary aspect may include a first non-display area IA1 provided on a first edge of the substrate 100, a second non-display area IA2 provided on a second edge of the substrate 100 parallel to the first non-display area IA1, a third non-display area IA3 provided on a third edge of the substrate 100, and a fourth non-display area IA4 provided on a fourth edge of the substrate 100 parallel to the third non-display area IA3. For example, the first non-display area IA1 may be an upper (or lower) edge area of the substrate 100, and the second non-display area IA2 may be a lower (or upper) edge area of the substrate 100, the third non-display area IA3 may be a left (or right) edge area of the substrate 100, and the fourth non-display area IA4 may be a right (or left) edge area of the substrate 100, but is not limited thereto.

The pixel array layer may be provided on the display area AA of the substrate 100. The pixel array layer according to an exemplary aspect may include the scan lines SL, the data lines DL, pixel driving power lines PL, and the pixels P.

The scan lines SL extend in the first direction X and are disposed along the second direction Y that intersects the first direction X. The display area AA of the substrate 100 includes a plurality of the scan lines SL spaced apart from each other in the second direction Y while being parallel to the first direction X. Here, the first direction X may be defined as a horizontal direction of the substrate 100, and the second direction Y may be defined as a longitudinal direction of the substrate 100, but the present disclosure is not limited thereto, and vice versa.

The data lines DL extend in the second direction Y and are disposed along the first direction X. The display area AA of the substrate 100 includes a plurality of the data lines DL spaced apart from each other in the first direction X while being parallel to the second direction Y.

The pixel driving power lines PL are disposed on the display area AA of the substrate 100 to be parallel to the data lines DL. The display area AA of the substrate 100 includes a plurality of the pixel driving power lines PL parallel to the data lines DL. Optionally, the pixel driving power lines PL may be disposed to be parallel to the scan lines SL.

The pixel P is disposed in a pixel area defined on the display area AA of the substrate 100 and is electrically connected to the scan line SL, the data line DL, and the pixel driving power line PL adjacent thereto. Here, the pixel area may be defined by intersection of the scan line SL and the data line DL.

The pixel P according to an exemplary aspect may be arranged to have a stripe structure on the display area AA. In this case, one unit pixel may include a red pixel, a green pixel, and a blue pixel, and furthermore, one unit pixel may further include a white pixel.

The pixel P according to another example may be arranged to have a pentile structure on the display area AA. In this case, one unit pixel may include at least one red pixel, at least two green pixels, and at least one blue pixel that are arranged in a polygonal shape in a plan view. For example, one unit pixel having a pentile structure may be arranged such that one red pixel, two green pixels, and one blue pixel have an octagonal shape in a plan view. In this case, the blue pixel may have a largest-sized opening area (or light emitting area), and the green pixel may have a smallest-sized opening area.

The pixel P may include a pixel circuit PC electrically connected to the scan line SL, the data line DL and the pixel driving power line PL that are adjacent thereto, and a light emitting element ED electrically connected to the pixel circuit PC.

The pixel circuit PC controls a current led flowing to the light emitting element ED from the pixel driving power line PL based on a data voltage supplied from the adjacent data line DL in response to the scan signal supplied from at least one scan line SL adjacent to the pixel circuit PC.

The pixel circuit PC according to an exemplary aspect may include two thin film transistors and one capacitor. For example, the pixel circuit PC according to an exemplary aspect may include a driving thin film transistor that supplies the data current Ted based on the data voltage to the light emitting element ED, a switching transistor supplying the data voltage supplied from the data line DL to the driving thin film transistor, and a capacitor storing a gate-source voltage of the driving thin film transistor.

The pixel circuit PC according to another exemplary aspect may include at least three thin film transistors and at least one capacitor. For example, the pixel circuit PC according to another exemplary aspect may include a current supply circuit, a data supply circuit, and a compensation circuit according to respective operations (or functions) of the at least three thin film transistors. Here, the current supply circuit may include a driving thin film transistor that supplies the data current Ted based on the data voltage to the light emitting element ED. The data supply circuit may include at least one switching thin film transistor that supplies the data voltage supplied from the data line DL to the current supply circuit in response to at least one scan signal. The compensation circuit may include at least one compensation thin film transistor that compensates for a change in a characteristic value (threshold voltage and/or mobility) of the driving thin film transistor in response to at least one scan signal.

The light emitting element ED emits light by the data current Ted supplied from the pixel circuit PC. The light emitting element ED emits light having a luminance corresponding to the data current Ted. In this case, the data current Ted may flow from the pixel driving power line PL to a common power line CPL through the driving thin film transistor and the light emitting element ED.

The light emitting element ED according to an exemplary aspect may include a pixel driving electrode (or a first electrode) electrically connected to the pixel circuit PC, a light emitting layer formed on the pixel driving electrode, and a common electrode (or second electrode) CE electrically connected to the light emitting layer.

The common power line CPL is disposed on the non-display area IA of the substrate 100 and is electrically connected to the common electrode CE disposed on the display area AA.

The common power line CPL according to an exemplary aspect is disposed along the second to fourth non-display areas IA2, IA3, and IA4 adjacent to the display area IA of the substrate 100, while having a constant line width. The common power line CPL surrounds a remainder portion excluding a portion of the display area AA adjacent to the first non-display area IA1 of the substrate 100. One end of the common power line CPL may be disposed on one side of the first non-display area IA1, and the other end of the common power line CPL may be disposed on the other side of the first non-display area IA1. In addition, the second to fourth non-display areas IA2, IA3, and IA4 may be surrounded between the one end and the other end of the common power line CPL. Accordingly, the common power line 137 according to an exemplary aspect may have a '∩' shape in which one side thereof corresponding to the first non-display area IA1 of the substrate 100 is opened, in a plan view.

The encapsulation layer may prevent oxygen or moisture from penetrating into the light emitting element ED provided in the pixel array layer. The encapsulation layer according to an exemplary aspect may include at least one inorganic film. The encapsulation layer according to another exemplary aspect may include a plurality of inorganic films and an organic film between the plurality of inorganic films.

The panel identification area PIA may be formed in the non-display area IA excluding the display area AA as shown in FIG. 3. FIG. 3 illustrates that the panel identification area PIA is disposed at an edge portion of a first side of the pad portion PAD, but aspects of the present disclosure are not limited thereto. For example, the panel identification area PIA may be disposed at an edge portion of a second side which is opposite to the first side of the substrate 100. Alternatively, the panel identification area PIA may be disposed at an edge portion of a third side or an edge portion of a fourth side of the substrate 100 in which the gate driving circuit 180 is formed.

Since the panel identification area PIA is formed by patterning a panel identification means (panel identification, hereinafter referred to as "a panel ID") on a panel identification layer formed on the substrate 100, using a laser, it may not to overlap with signal lines formed in the non-display area IA. Accordingly, the panel identification area PIA may be formed at any position of the non-display area IA on an upper surface of the substrate 100 as long as it does not overlap with the signal lines formed in the non-display area IA.

Figure 4:
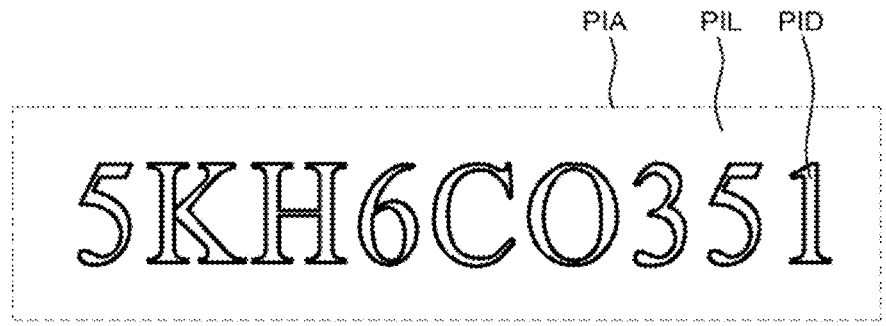
FIG. 4 is an enlarged view of a panel identification area illustrated in FIG. 3.

FIG. 4 is an enlarged plan view illustrating a lower substrate on which the panel identification area of FIG. 3 is formed, in detail.

With reference to FIG. 4, the panel identification area PIA includes a panel identification layer PIL and a panel ID PID.

The panel identification layer PIL may be formed in the entirety of the panel identification area PIA as shown in FIG. 4. The panel identification area PIA may be defined as an area where the panel identification layer PIL is formed. The panel identification layer PIL may be formed of a metal layer on which the panel ID PID may be patterned. For example, the panel identification layer PIL may be formed of the same metal layer as the gate electrode.

The panel ID PID corresponds to a unique panel identification means having a different value for each display panel. The panel ID PID may be formed of any one of letters, numbers, and symbols or a combination thereof, as shown in FIG. 4. FIG. 4 illustrates that the panel ID PID is composed of a combination of letters and numbers.

The panel ID PID is patterned on the panel identification layer PIL. Specifically, the panel ID PID may be formed to be engraved compared to the panel identification layer PIL. For example, the panel ID PID may be formed in an engraved pattern on the panel identification layer PIL using a laser. Accordingly, when the panel ID PID is recognized using an OCR (optical character reader), the panel ID PID may be optically distinguishable from the panel identification layer PIL. Therefore, the panel ID PID can be recognized using the OCR.

An area where a camera is mounted may be included in the display area AA. There are many cases in which sizes (in particular, planar areas) of display devices are restricted for the reason of manufacturing efficiency and/or aesthetic reasons. If an area where the camera is mounted is provided in the non-display area IA, a size of the non-display area IA increases, whereby a size of the display area AA decreases correspondingly. On the other hand, when the area where the camera is mounted is provided in the display area AA, the size of the non-display area IA can be reduced by an amount equal to the area, so that the size of the display area AA can be maximized.

Accordingly, in the display device according to the exemplary aspect of the present disclosure, the size of the non-display area IA may be reduced, and the size of the display area AA may be further extended by placing the area where an imaging element such as a camera or the like is disposed, within the display area AA.

The inventors of the present disclosure have found a problem associated with providing a camera disposition area in the display area AA of the touch screen-integrated organic light emitting display device. After forming the camera disposition area in the display area AA, a process of forming the touch sensor layer on an upper portion of the encapsulation layer is performed in a chamber. After the display panel having the encapsulation layer is placed in the chamber, an inside of the chamber needs to be a vacuum state. At this time, layer delamination occurs in the opening of the camera disposition area. When the layer delamination occurs, the inside of the chamber may be contaminated. In addition, moisture and oxygen penetrate into a portion where the layer delamination occurs, whereby the light emitting element ED is damaged, resulting in malfunction of the display panel.

To prevent the layer delamination, a side surface and a peripheral portion of the opening in the camera disposition area need to be covered with a protective layer. The protective layer may be formed in various forms, and may be formed of an organic insulating layer such as benzocyclobutene (BCB) or acryl. To form the protective layer in the camera disposition area, after depositing an organic material on the entirety of an upper surface of the display panel, a process of removing the organic material applied to a remaining area excluding the camera disposition area is performed. The removal of the organic material is performed using a chemical solution. However, in the process of removing the organic material, a phenomenon in which the panel ID PID formed in the engraved pattern on the panel identification layer PIL is lost by the chemical solution remaining after removing the organic material may occur.

Figure 5:
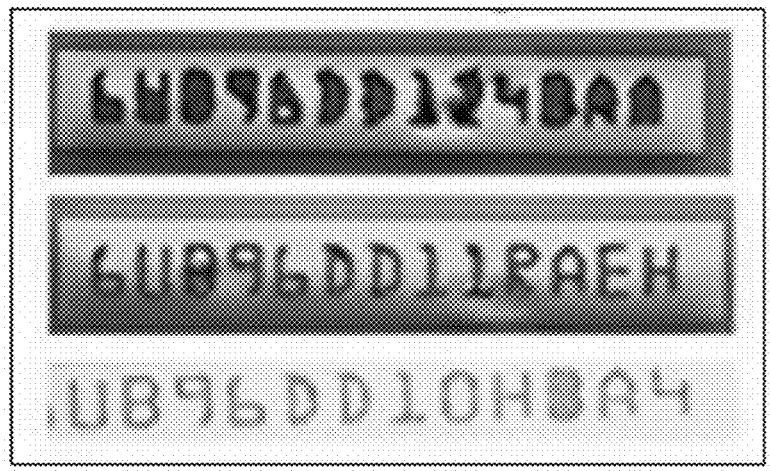
FIG. 5 is a photograph showing a result of loss of a panel identification layer.

FIG. 5 is a photograph obtained by imaging the panel ID after removing the organic material.

With reference to FIG. 5, it can be seen that the panel ID is partially lost by the chemical solution for removing the organic material. When the panel ID is lost and a recognition error occurs, a process delay may occur to re-recognize the panel ID. In addition, if the panel ID is recognized as an error, an error may occur in tracking a process history or the process history tracking may be infeasible. Accordingly, the inventors have recognized these problems and have invented a new structure for the panel identification area.

Figure 6:
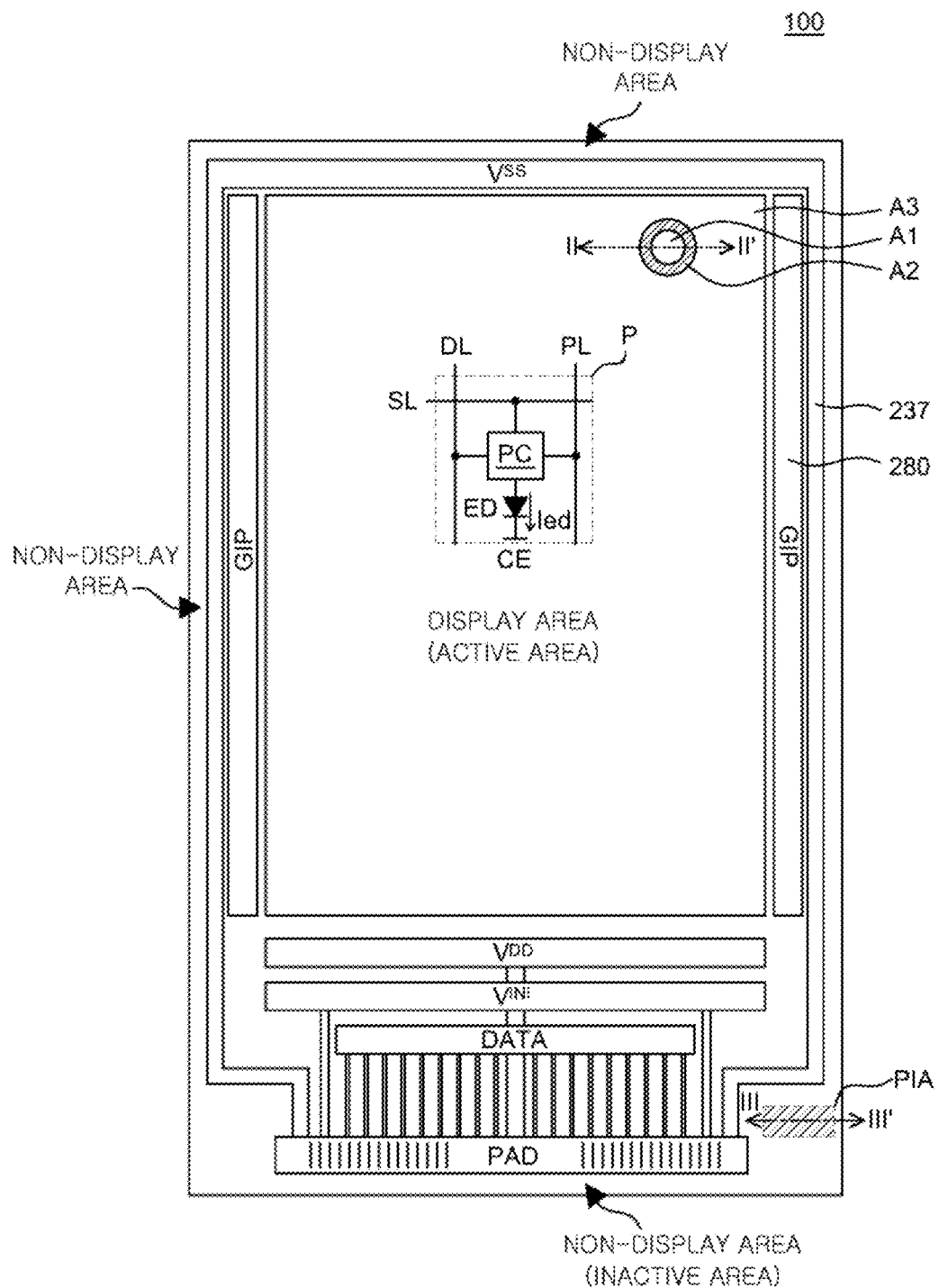
FIG. 6 is a plan view schematically illustrating an organic light emitting display device according to an exemplary aspect of the present disclosure.
Figure 7:
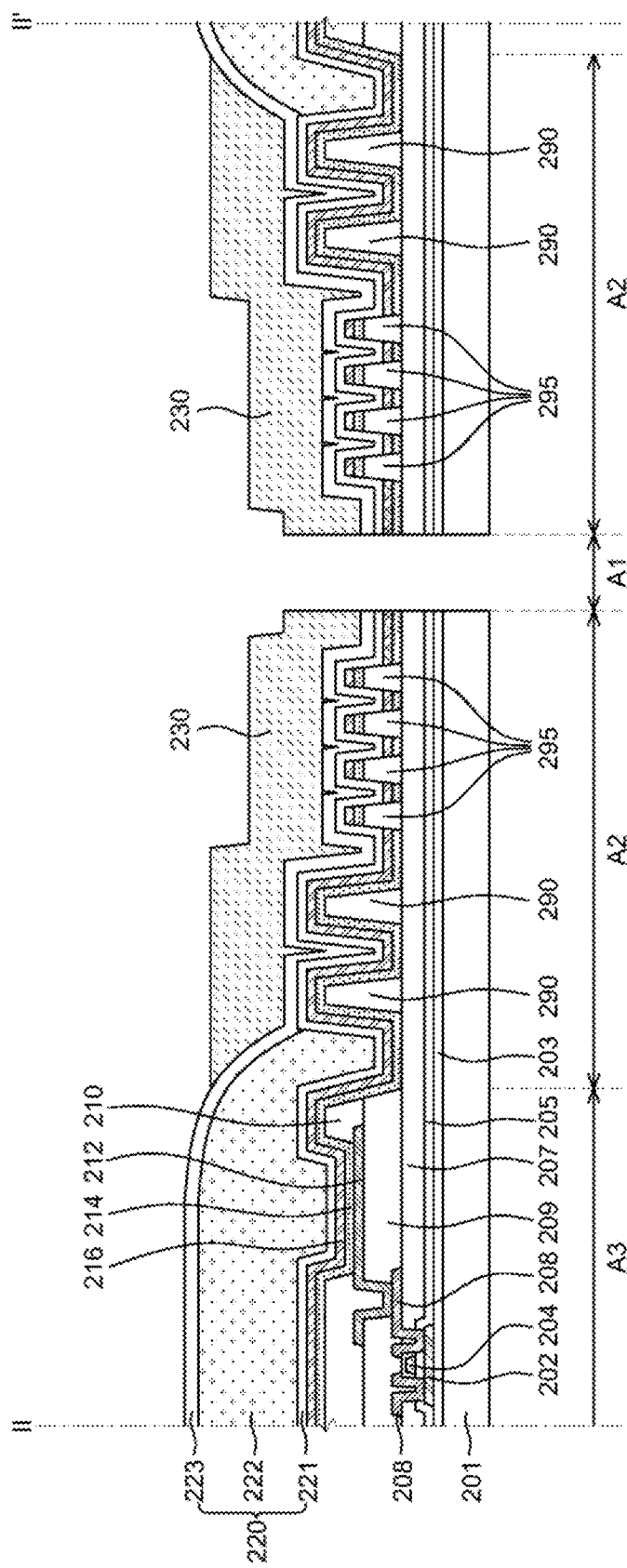
FIG. 7 is a cross-sectional view illustrating a display area of the organic light emitting display device, taken along line II-II' of FIG. 6.
Figure 8:
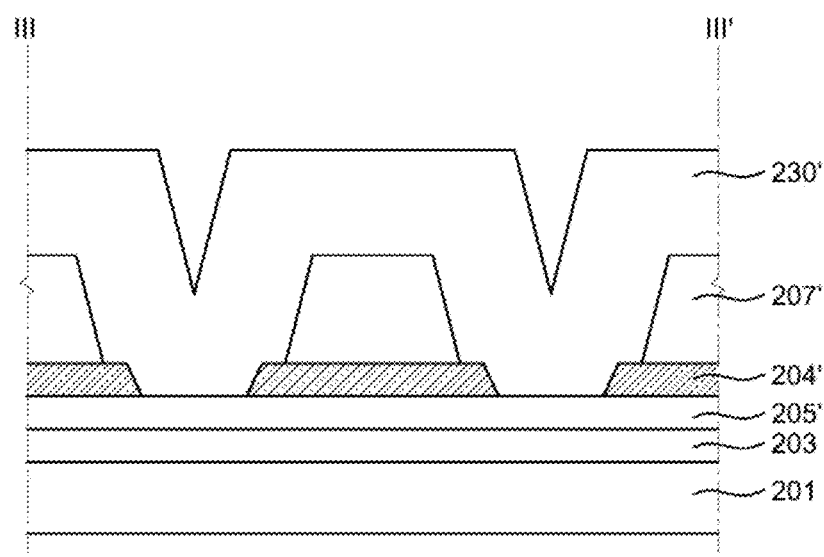
FIG. 8 is a cross-sectional view illustrating a panel identification area of the organic light emitting display device, taken along line of FIG. 6.

FIG. 6 is a plan view schematically illustrating an organic light emitting display device according to an exemplary aspect of the present disclosure. FIG. 7 is a view showing a cross-section, taken along line of FIG. 6. FIG. 8 is a view showing a cross-section, taken along line of FIG. 6.

With reference to FIGS. 6 to 8, the first area A1, the second area A2, and the third area A3 may be applied to at least a portion of the display area AA described in FIG. 3.

A base layer 201 corresponding to the first area A1, and functional layers thereover are removed. Accordingly, in the first area A1, a through-hole and an imaging device (not shown) are positioned in a vertical direction. In this case, a removal process may be a punching process using a laser or the like. The imaging device may be placed under the base layer 201 in the first area A1.

In the third area A3, thin film transistors 202, 204, 208, organic light emitting elements 212, 214, 216, and various functional layers are positioned on the base layer 201.

The base layer 201 supports various components of the organic light emitting display device. The base layer 201 may be formed of a transparent insulating material, for example, an insulating material such as glass or plastic. The substrate (array substrate) may be referred to as a concept including elements and a functional layer formed on the base layer 201, for example, a switching TFT, a driving TFT, an organic light emitting element, and a protective layer.

A buffer layer 203 may be positioned on the base layer 201. The buffer layer is a functional layer for protecting a thin film transistor (TFT) from impurities such as alkali ions, flowing out from the base layer 201 or layers under the buffer layer. The buffer layer 203 may be formed of silicon oxide (SiOx) or silicon nitride (SiNx), or multiple layers thereof. The buffer layer 203 may include a multi buffer and/or an active buffer.

A thin film transistor is placed on the base layer 201 or the buffer layer 203. The thin film transistor may be in a form in which a semiconductor layer (an active layer 202), a gate insulating layer (a gate insulator 205), a gate electrode 204, an interlayer insulating layer (an interlayer dielectric layer 207), and source and drain electrodes 208 are sequentially stacked, as in FIG. 7. Unlike this, the thin film transistor may be in a form in which a gate electrode, a gate insulating layer, a semiconductor layer, and source and drain electrodes are sequentially disposed.

The semiconductor layer 202 may be formed of polysilicon (p-Si), and in this case, a predetermined area of the semiconductor layer 202 may be doped with impurities. Further, the semiconductor layer 202 may be formed of amorphous silicon (a-Si), or may be formed of various organic semiconductor materials such as pentacene and the like. Furthermore, the semiconductor layer 202 may be formed of oxide.

The gate electrode 204 may be formed of various conductive materials, such as magnesium (Mg), aluminum (Al), nickel (Ni), chromium (Cr), molybdenum (Mo), tungsten (W), gold (Au), or alloys thereof or the like.

The gate insulating layer 205 and the interlayer insulating layer 207 may be formed of an insulating material such as silicon oxide (SiOx) or silicon nitride (SiNx), or may be formed of an insulating organic material. By a selective removal of the gate insulating layer 205 and the interlayer insulating layer 207, contact holes through which source and drain regions are exposed may be formed.

The source and drain electrodes 208 are formed as a single layer or multiple layers formed of an electrode material, on the gate insulating layer 205 or the interlayer insulating layer 207. If necessary, a passivation layer formed of an inorganic insulating material may cover the source and drain electrodes 208.

An auxiliary electrode (not shown) may be disposed between the gate electrode 204 and the source and drain electrodes 208. The auxiliary electrode may be formed of the same material as the gate electrode 204, and may be insulated from the source and drain electrodes 208 by a second interlayer insulating layer (not shown). The auxiliary electrode may serve as a storage capacitor between the source and drain electrodes and the gate electrode.

A planarization layer 209 may be located on the thin film transistor. The planarization layer 209 protects the thin film transistor and planarizes an upper portion of the thin film transistor. The planarization layer 109 may be formed in various shapes, and may be formed as an organic insulating layer such as benzocyclobutene (BCB) or acryl, or an inorganic insulating layer such as a silicon nitride layer (SiNx) or silicon oxide layer (SiOx). Various modifications are possible, for example, the planarization layer 109 may be formed of a single layer or composed of double or multiple layers.

The organic light emitting element may have a form in which a first electrode 212, an organic light emitting layer 214, and a second electrode 216 are sequentially arranged. That is, the organic light emitting element may include the first electrode 212 formed on the planarization layer 209, the organic light emitting layer 214 located on the first electrode 212, and the second electrode 216 located on the organic light emitting layer 214.

The first electrode 212 is electrically connected to the drain electrode 208 of the driving thin film transistor through the contact holes. When the organic light emitting display device is a top emission type, the first electrode 212 may be formed of an opaque conductive material having high reflectance. For example, the first electrode 212 may be formed of silver (Ag), aluminum (Al), gold (Au), molybdenum (Mo), tungsten (W), chromium (Cr), or alloys thereof or the like. The first electrode 212 may be an anode of an organic light emitting diode.

A bank 210 is formed in remaining areas excluding a light emitting area. Accordingly, the bank 210 has a bank hole that exposes the first electrode 212 corresponding to the light emitting area. The bank 210 may be formed of an inorganic insulating material such as a silicon nitride layer (SiNx) or a silicon oxide layer (SiOx) or an organic insulating material such as BCB, acrylic resin, or imide resin.

The organic light emitting layer 214 is positioned on the first electrode 212. The organic light emitting layer 214 may include a light emitting layer, an electron injection layer, an electron transport layer, a hole transport layer, a hole injection layer, and the like. The layers may be formed over the entirety of a light emitting portion (third area) or formed only in a portion of the light emitting portion (third area), depending on necessity or a process. The organic light emitting layer may be configured to have a single light emitting layer structure that emits one light, or may be configured to have a plurality of light emitting layers to thereby emit white light.

The second electrode 216 is positioned on the organic light emitting layer 214. When the organic light emitting display device is a top emission type, the second electrode 216 is formed of a transparent conductive material such as indium tin oxide (ITO) or indium zinc oxide (IZO), whereby light generated from the organic light emitting layer 214 is emitted upwardly of the second electrode 216. The second electrode 216 may be a cathode of the organic light emitting diode.

An encapsulation layer 220 is positioned on the second electrode 216. The encapsulation layer 220 prevents penetration of oxygen and moisture from the outside in order to prevent oxidation of a light emitting material and an electrode material. When the organic light emitting element is exposed to moisture or oxygen, a pixel shrinkage phenomenon in which the light emitting area is shrunken may occur, or a dark spot within the light emitting area may occur. The encapsulation layer may be composed of an inorganic film formed of glass, metal, aluminum oxide (AlOx) or a silicon (Si)-based material, or may have a structure in which an organic film 222 and inorganic films 221 and 223 are alternately stacked. At this time, the inorganic films 221 and 223 serve to block the penetration of moisture or oxygen, and the organic film 222 serves to flatten surfaces of the inorganic films 221 and 223. When the encapsulation layer is formed of multiple thin film layers, a path of movement of moisture or oxygen is longer and more complicated, compared to a case in which it is formed of a single layer, thereby making it difficult for moisture/oxygen to penetrate into the organic light emitting element.

A barrier film may be positioned on the encapsulation layer 220 and encapsulate the entirety of the base layer 201. The barrier film may be a retardation film or an optically isotropic film. At this time, an adhesive layer may be positioned between the barrier film and the encapsulation layer 220. The adhesive layer bonds the encapsulation layer 220 and the barrier film. The adhesive layer may be a thermosetting or self-curing adhesive. For example, the adhesive layer may be formed of a material such as barrier pressure sensitive adhesive (B-PSA).

The second area A2 includes no light emitting element, but instead, it includes a bypass line (not shown), a blocking structure 290, a disconnecting structure 295, and the like, thereby preventing mutual influence between the first area A1 and the third area A3.

The bypass line is configured such that various lines that have passed the first area A1 in a horizontal or vertical direction avoid the first area A1 and extend. The bypass line may be configured on the same layer as or on a different layer from existing lines.

The blocking structure 290 is provided to prevent the organic film 222 of the encapsulation layer 220 from flowing into the first area A1. FIG. 2 illustrates that a flow of the organic film 222 is blocked by an internal blocking structure disposed more inwardly from among two blocking structures, but the organic film 222 may pass the internal blocking structure and be blocked by an outer blocking structure.

The disconnecting structure 295 is provided to disconnect a connection of the organic light emitting layer 214. This is because that when the organic light emitting layer 214 is exposed outwardly, it may be a path of penetration of moisture. Since the organic light emitting layer 214 may be exposed outwardly in the first area A1, the disconnecting structure 295 is required.

Some of functional layers in the third area A3 also remain in the second area A2. In addition, some of the functional layers may be used when forming the blocking structure 290, the disconnecting structure 295, and the like. For example, a material used in the planarization layer 209 and/or the bank layer 210 may be used for the blocking structure 290, and a material used in the planarization layer 209 may be used for the disconnecting structure 295.

An upper protective layer 230 may be disposed on an upper portion of the encapsulation layer 220. The upper protective layer 230 is formed on the second region A2 and may be formed of an organic material such as benzocyclobutene (BCB) or photoacryl. As described above, in a process of forming the touch sensor layer after the upper protective layer 230 is formed of an organic material, it is feasible to prevent the occurrence of layer delamination in the camera disposition area.

Meanwhile, various driving circuits (e.g. GIP), electrodes, lines, functional structures, and the like may be located on the base layer 101 in the non-display area IA. The pixel circuit and the light emitting element are not disposed in the non-display area IA, but the base layer 201 and organic/inorganic functional layers 203, 205, 207, 209, and the like may be present therein. In addition, materials used in components of the display area AA may be disposed in the non-display area IA for other uses. For example, the same metal as the gate electrode of the TFT in the display area AA or the same metal as the source/drain electrode of the TFT in the display area AA may be disposed in the non-display area IA for lines or electrodes. Furthermore, the same metal as one electrode (e.g. anode) of the organic light emitting diode may be disposed in the non-display area IA for lines and electrodes.

FIG. 8 is a cross-sectional view schematically illustrating the panel identification area PIA of the display device according to an exemplary aspect of the present disclosure.

With reference to FIG. 8, the base layer 201 supports various components of the organic light emitting display device. The base layer 201 may be formed of a transparent insulating material, for example, an insulating material such as glass or plastic. The substrate (array substrate) may be referred to as a concept including elements and a functional layer formed on the base layer 201, for example, a switching TFT, a driving TFT, an organic light emitting element, or a protective layer.

The buffer layer 203 may be positioned on the base layer 201. The buffer layer is a functional layer for protecting the thin film transistor (TFT) from impurities such as alkali ions, flowing out from the base layer 201 or layers under the buffer layer. The buffer layer may be formed of silicon oxide (SiOx), silicon nitride (SiNx), or multiple layers thereof. The buffer layer 203 may include a multi buffer and/or an active buffer.

The gate insulating layer 205 may be disposed on the buffer layer 203. The gate insulating layer 205 may be formed of an insulating material such as silicon oxide (SiOx) or silicon nitride (SiNx), or may be formed of an insulating organic material.

A panel identification layer (PIL) 204' may be provided on the gate insulating layer 205. The panel identification layer (PIL) 204' is disposed on the same layer as the gate electrode 204 of the display area AA, and may be formed of the same material as the gate electrode 204 of the display area AA. For example, the panel identification layer (PIL) 204' may be formed of magnesium (Mg), aluminum (Al), nickel (Ni), chromium (Cr), molybdenum (Mo), tungsten (W), gold (Au), or alloys thereof or the like.

A lower protective layer 207' may be disposed on the panel identification layer 204'. The lower protective layer 207' is disposed on the same layer as the interlayer insulating layer 207 of the display area AA, and may be formed of the same material as the interlayer insulating layer 207 of the display area AA. For example, the lower protective layer 207' may be formed of an insulating material such as silicon oxide (SiOx) or silicon nitride (SiNx), or may be formed of an insulating organic material.

The upper protective layer 230 may be disposed on the lower protective layer 207'. The upper protective layer covers the panel identification area PIA, and may be in contact with the panel identification layer 204' and the lower protective layer 207'. The upper protective layer 230 may be formed of an organic material such as benzocyclobutene (BCB) or photoacrylic.

When an auxiliary electrode (not shown) is formed on the gate electrode 204 of the display area AA, a second interlayer insulating layer may be disposed between the lower protective layer 207' and the upper protective layer 230.

As described above, in the organic light emitting display device according to an exemplary aspect of the present disclosure, the same protective layer as the upper protective layer formed of an organic material, which prevents layer delamination from occurring in an upper portion of the camera disposition area of the display area AA, is disposed on the panel identification area disposed in the non-display area IA of the substrate. Thus, a phenomenon in which a panel identification layer is etched and lost by a chemical solution used when removing the protective layer on the second area A2 may be prevented. Accordingly, problems such as a process delay occurring due to damage to the panel ID, and inability to track a process history of the display panel, are not caused, so that productivity can be further improved.

The exemplary aspects of the present disclosure can also be described as follows:

According to an aspect of the present disclosure, there is provided an organic light emitting display device. An organic light emitting display device comprising: a substrate having a display area divided to display an image and a non-display area around the display area; a camera disposition area provided within the display area; a panel identification area provided in the non-display area; and an upper protective layer covering the camera disposition area and the panel identification area.

The camera disposition area may include an opening penetrating the substrate and a boundary area disposed in contact with an outer edge of the opening.

The upper protective layer may cover a portion of a side surface of the opening and an upper portion of the boundary area.

The upper protective layer may prevent layer delamination in the opening.

The upper protective layer may include at least one of benzocyclobutene (BCB) or photoacryl.

The organic light emitting display device further comprising: a thin film transistor provided in the display area excluding the camera disposition area, wherein the thin film transistor includes a semiconductor layer, a gate electrode, source and drain electrodes, a gate insulating layer disposed between the semiconductor layer and the gate electrode, and an interlayer insulating layer insulating the gate electrode and the source and drain electrodes from each other.

The organic light emitting display device further comprising: a panel identification layer and a lower protective layer disposed in the panel identification area.

The panel identification layer may be disposed on the same layer as the gate electrode and is formed of the same material as the gate electrode.

A panel ID expressed by engraving the panel identification layer and the lower protective layer may be positioned in the panel identification area.

The panel ID may include at least one of numbers, letters, or shapes.

The lower protective layer may be disposed on the same layer as the interlayer insulating layer and is formed of the same material as the interlayer insulating layer.

The upper protective layer may cover the panel identification area and is in contact with the panel identification layer and the lower protective layer.

The upper protective layer may be removed in an upper portion of the display area excluding the opening and the boundary area.

The upper protective layer may cover an upper portion of the display area adjacent to the boundary area.

The upper protective layer may prevent a panel ID from being lost by a chemical solution when removing the upper protective layer on an organic light emitting element of the display area.

The organic light emitting display device further comprising: a second interlayer insulating layer positioned between the lower protective layer and the upper protective layer.

The organic light emitting display device further comprising: an organic light emitting element on the thin film transistor and electrically connected to the thin film transistor.

The organic light emitting display device further comprising: an encapsulation layer covering the organic light emitting element.

The organic light emitting display device further comprising: a touch sensor layer having a touch electrode disposed on the encapsulation layer.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display device comprising:
   a substrate having a display area displaying an image and a non-display area surrounding the display area;
   a first area provided in the display area;
   a second area provided in the display area and surrounding the first area; and
   a panel identification area provided in the non-display area and including a panel identification layer, a lower protection layer disposed on the identification layer and an upper protection layer disposed on the lower protection layer,
   wherein the first area is a portion where an opening penetrating the substrate is provided and a camera is disposed, and
   wherein the upper protective layer covers the first area, the second area and the panel identification area.

2. The organic light emitting display device of claim 1, wherein the second area is disposed in contact with an outer edge of the opening.

3. The organic light emitting display device of claim 1, wherein the upper protective layer covers a portion of a side surface of the opening and an upper portion of the second area.

4. The organic light emitting display device of claim 3, wherein the upper protective layer prevents layer delamination in the opening.

5. The organic light emitting display device of claim 4, wherein the upper protective layer includes at least one of benzocyclobutene (BCB) and photoacryl.

6. The organic light emitting display device of claim 1, further comprising a thin film transistor provided in the display area excluding the first area and second area,
   wherein the thin film transistor includes a semiconductor layer, a gate electrode, source and drain electrodes, a gate insulating layer disposed between the semiconductor layer and the gate electrode, and an interlayer insulating layer insulating the gate electrode and the source and drain electrodes from each other.

7. The organic light emitting display device of claim 6, further comprising a gate insulation layer on which the panel identification layer and the lower protective layer disposed in the panel identification area.

8. The organic light emitting display device of claim 7, wherein the panel identification layer is disposed on a same layer as the gate electrode and is formed of a same material as the gate electrode.

9. The organic light emitting display device of claim 7, wherein the panel identification layer has a panel ID engraved therein and the lower protective layer is positioned in the panel identification area.

10. The organic light emitting display device of claim 9, wherein the panel ID includes at least one of numbers, letters and shapes.

11. The organic light emitting display device of claim 7, wherein the lower protective layer is disposed on a same layer as the interlayer insulating layer.

12. The organic light emitting display device of claim 11, wherein the lower protective layer is formed of a same material as the interlayer insulating layer.

13. The organic light emitting display device of claim 7, wherein the upper protective layer covers the panel identification area and is in contact with the panel identification layer and the lower protective layer.

14. The organic light emitting display device of claim 13, wherein the upper protective layer is removed in an upper portion of the display area excluding the opening and the second area.

15. The organic light emitting display device of claim 13, wherein the upper protective layer covers an upper portion of the display area adjacent to the second area.

16. The organic light emitting display device of claim 14, wherein the upper protective layer prevents a panel ID from being lost by a chemical solution when the upper protective layer on an organic light emitting element of the display area is removed by the chemical solution.

17. The organic light emitting display device of claim 11, further comprising a second interlayer insulating layer positioned between the lower protective layer and the upper protective layer.

18. The organic light emitting display device of claim 6, further comprising an organic light emitting element on the thin film transistor and electrically connected to the thin film transistor.

19. The organic light emitting display device of claim 18, further comprising an encapsulation layer covering the organic light emitting element.

20. The organic light emitting display device of claim 19, further comprising a touch sensor having at least one touch electrode disposed on the encapsulation layer.

* * * * *